(12) United States Patent
Lee et al.

(10) Patent No.: US 10,475,738 B2
(45) Date of Patent: Nov. 12, 2019

(54) MULTI-THRESHOLD VOLTAGE SEMICONDUCTOR DEVICE

(71) Applicant: UNITED MICROELECTRONICS CORP., Hsin-Chu (TW)

(72) Inventors: Kung-Hong Lee, Pingtung County (TW); Mu-Kai Tsai, Hsinchu County (TW); Chung-Hsing Lin, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/391,822

(22) Filed: Dec. 27, 2016

(65) Prior Publication Data

US 2018/0182860 A1 Jun. 28, 2018

(51) Int. Cl.

| | |
|---|---|
| *H01L 23/522* | (2006.01) |
| *H01L 49/02* | (2006.01) |
| *H01L 27/088* | (2006.01) |
| *H01L 27/092* | (2006.01) |
| *H01L 21/8234* | (2006.01) |
| *H01L 21/8238* | (2006.01) |
| *H01L 29/78* | (2006.01) |

(52) U.S. Cl.
CPC .... *H01L 23/5223* (2013.01); *H01L 21/82345* (2013.01); *H01L 21/823842* (2013.01); *H01L 27/088* (2013.01); *H01L 27/092* (2013.01); *H01L 28/55* (2013.01); *H01L 29/785* (2013.01)

(58) Field of Classification Search
CPC ............. H01L 27/11502; H01L 29/516; H01L 29/78391
See application file for complete search history.

(56) References Cited

U.S. PATENT DOCUMENTS

| | | | | |
|---|---|---|---|---|
| 5,965,942 A | * | 10/1999 | Itoh ...................... | H01L 21/7687 257/295 |
| 6,140,672 A | * | 10/2000 | Arita ................. | H01L 21/76895 257/295 |
| 6,188,600 B1 | * | 2/2001 | Ishiwara ........... | H01L 27/11502 257/E27.104 |
| 6,407,422 B1 | * | 6/2002 | Asano ..................... | H01L 28/75 257/296 |

(Continued)

FOREIGN PATENT DOCUMENTS

| | | |
|---|---|---|
| CN | 105609562 A | 5/2016 |
| CN | 105742362 A | 7/2016 |

(Continued)

OTHER PUBLICATIONS

Chun Wing Yeung, Title: Device Design Considerations for Ultra-Thin Body Non-Hysteretic Negative Capacitance FETs, IEEE, 2013.

(Continued)

*Primary Examiner* — Michele Fan
(74) *Attorney, Agent, or Firm* — Winston Hsu

(57) ABSTRACT

A semiconductor device preferably includes: a first metal-oxide semiconductor (MOS) transistor on a substrate; a first ferroelectric (FE) layer connected to the first MOS transistor; a second MOS transistor on the substrate; and a second FE layer connected to the second MOS transistor. Preferably, the first FE layer and the second FE layer include different capacitance.

16 Claims, 4 Drawing Sheets

(56) References Cited

U.S. PATENT DOCUMENTS

| | | | |
|---|---|---|---|
| 6,852,240 B2* | 2/2005 | Hartner | H01L 28/55 216/6 |
| 8,362,604 B2 | 1/2013 | Ionescu | |
| 8,785,995 B2 | 7/2014 | Dubourdieu et al. | |
| 2002/0040988 A1* | 4/2002 | Hidaka | H01L 21/76801 257/296 |
| 2002/0075736 A1* | 6/2002 | Kumura | H01L 27/11502 365/200 |
| 2002/0102791 A1* | 8/2002 | Kurasawa | H01L 28/55 438/240 |
| 2003/0178659 A1* | 9/2003 | Kato | H01L 27/0629 257/296 |
| 2004/0082117 A1* | 4/2004 | Kastner | H01L 27/108 438/142 |
| 2005/0205910 A1* | 9/2005 | Kumura | H01L 27/11502 257/295 |
| 2006/0046319 A1* | 3/2006 | Takeda | B41J 2/161 438/3 |
| 2006/0160252 A1* | 7/2006 | Song | H01L 27/11502 438/3 |
| 2010/0055805 A1* | 3/2010 | Wang | H01L 21/31691 438/3 |
| 2012/0118383 A1* | 5/2012 | Bedell | H01L 31/02008 136/261 |
| 2015/0221658 A1* | 8/2015 | Wang | H01L 21/324 257/532 |
| 2017/0040331 A1* | 2/2017 | Van Houdt | H01L 29/78391 |

FOREIGN PATENT DOCUMENTS

| | | | |
|---|---|---|---|
| CN | 105789312 A | 7/2016 | |
| WO | WO-2017171837 A1 * | 10/2017 | G11C 11/22 |

OTHER PUBLICATIONS

Kai-Shin Li, Title: Sub-60mV-Swing Negative-Capacitance FinFET without Hysteresis, IEDM, 2015.

Asif Islam Khan, Title: Negative Capacitance in Short-Channel FinFETs Externally Connected to an Epitaxial Ferroelectric Capacitor, IEEE Electron Device Letters, vol. 37, No. 1, Jan. 2016.

* cited by examiner

MULTI-THRESHOLD VOLTAGE SEMICONDUCTOR DEVICE

BACKGROUND OF THE INVENTION

1. Field of the Invention

The invention relates a semiconductor device, and more particularly, to a multi-threshold voltage (Multi-Vt) semiconductor device.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

Current design of both planar MOS transistors and FinFET devices achieve multi-threshold voltage by either using doping implant or multi work function metal layers. Nevertheless, either one of these approaches has found to be incompetent in achieving desirable threshold voltages. Hence, how to improve the conventional means for effectively achieving multi-threshold voltage in either planar MOS transistors or FinFET devices has become an important task in this field.

SUMMARY OF THE INVENTION

According to a preferred embodiment of the present invention, a semiconductor device preferably includes: a first metal-oxide semiconductor (MOS) transistor on a substrate; a first ferroelectric (FE) layer connected to the first MOS transistor; a second MOS transistor on the substrate; and a second FE layer connected to the second MOS transistor. Preferably, the first FE layer and the second FE layer include different capacitance, or more specifically, the first FE layer and the second FE layer could have different area, different thickness, or different dielectric constant.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
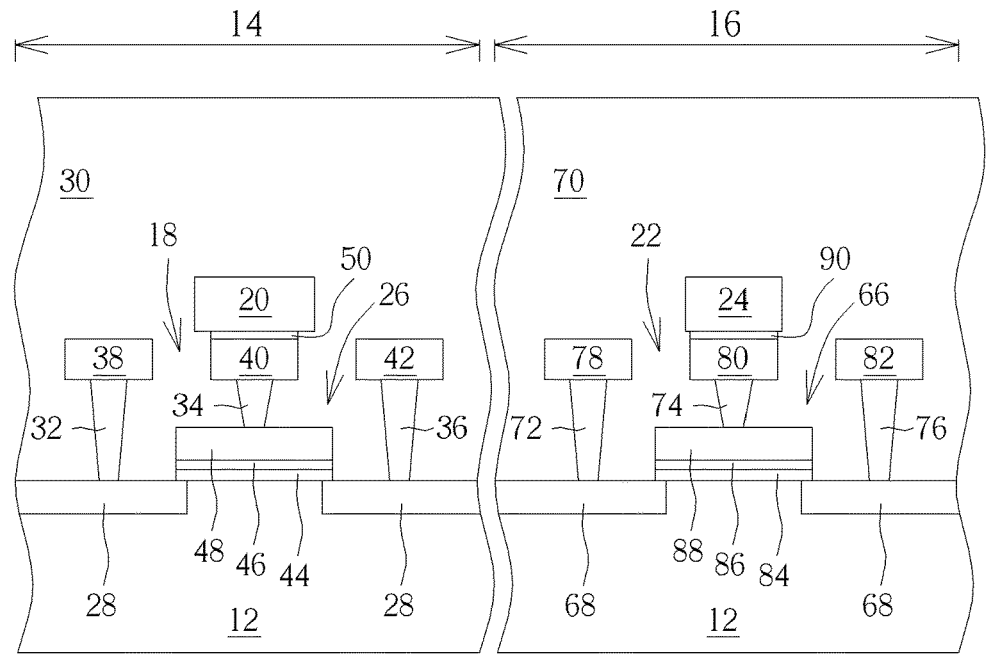
FIG. 1 illustrates a structural view of a semiconductor device according to a first embodiment of the present invention.

Referring to FIG. 1, FIG. 1 illustrates a structural view of a semiconductor device according to a first embodiment of the present invention. As shown in FIG. 1, the semiconductor device preferably includes a substrate 12, a first region 14 and a second region 16 defined on the substrate 12, a first metal-oxide semiconductor (MOS) transistor 18 formed on the first region 18, a first ferroelectric (FE) layer 20 connected to the first MOS transistor 18, a second MOS transistor 22 formed on the second region 16, and a second FE layer 24 connected to the second MOS transistor 22.

In this embodiment, the first region 14 and the second region 16 are defined to fabricate MOS transistors having different threshold voltages in the later process, in which the first region 14 and the second region 16 could share same conductive type or different conductive type depending on the demand of product. For instance, both of the MOS transistors fabricated on the first region 14 and second region 16 could be NMOS transistors, both of the MOS transistors fabricated on the first region 14 and the second region 16 could be PMOS transistors, or one of the MOS transistor fabricated on the first region 14 being a NMOS transistor while the other MOS transistor fabricated on the second region 16 being a PMOS transistor, which are all within the scope of the present invention.

In this embodiment, the substrate 12 could be a semiconductor substrate such as a silicon substrate, an epitaxial substrate, a SiC substrate, or a silicon-on-insulator (SOI) substrate, but not limited thereto. A well region (not shown) could also be formed in the substrate 12 through an ion implantation process to implant dopants of adequate conductive type depending on the device being fabricated.

It should be noted that even though this embodiment pertains to the fabrication of a planar device, it would also be desirable to apply the process of the present invention to a non-planar device and in such instance, the substrate 12 shown in FIG. 1 would become a fin-shaped structure formed atop a substrate, which is also within the scope of the present invention.

If a non-planar device were to be prepared, the fin-shaped structure could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structure could also be obtained by first forming a patterned mask (not shown) on the substrate, 12, and through an etching process, the pattern of the patterned mask is transferred to the substrate 12 to form the fin-shaped structure. Moreover, the formation of the fin-shaped structure could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structure. These approaches for forming fin-shaped structure are all within the scope of the present invention.

Each of the first MOS transistor 18 and the second MOS transistor 22 includes transistor elements such as a gate structure, a source/drain region, and conductive lines electrically connected to the gate structure and the source/drain region.

For instance, the first MOS transistor 18 includes a gate structure 26, a source/drain region 28 adjacent to two sides of the gate structure 26, at least one or more dielectric layer such as interlayer dielectric (ILD) layer 30 disposed on the gate structure 26 and the substrate 12, and conductors 32, 34, 36 and patterned metal layers 38, 40, 42 disposed within the ILD layer 30 to electrically connect to the gate structure 26 and the source/drain region 28. The gate structure 26 further includes a gate dielectric layer 44 or interfacial layer on the substrate 12, a high-k dielectric layer 46 on the gate dielectric layer 44, and a gate electrode 48 on the high-k dielectric layer 46.

The gate dielectric layer 44 of the gate structure 26 could include $SiO_2$, SiN, or high-k dielectric material and the gate electrode 48 could include metal, polysilicon, or silicide.

In this embodiment, the high-k dielectric layer 46 is preferably selected from dielectric materials having dielectric constant (k value) larger than 4. For instance, the high-k dielectric layer 46 may be selected from hafnium oxide ($HfO_2$), hafnium silicon oxide ($HfSiO_4$), hafnium silicon oxynitride (HfSiON), aluminum oxide ($AL_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

Preferably, the formation of the gate structure 26 could be accomplished by a gate first process, a high-k first approach from gate last process, or a high-k last approach from gate last process. If either a high-k first approach or high-k last approach were employed to form the gate structure 26, a work function metal layer (not shown) and a low resistance metal layer (not shown) could be disposed atop the high-k dielectric layer 46, in which the high-k dielectric layer would reveal either an I-shaped cross-section or U-shaped cross-section depending on which of the fabrication schemes were chosen.

The work function metal layer could include either a n-type work function metal layer or a p-type work function metal layer. For example, a n-type work function metal layer having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. A p-type work function metal layer having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer and the low resistance metal layer, in which the material of the barrier layer may include titanium (Ti), titanium nitride (TiN), tantalum (Ta) or tantalum nitride (TaN). The material of the low-resistance metal layer may include copper (Cu), aluminum (Al), titanium aluminum (TiAl), cobalt tungsten phosphide (CoWP) or any combination thereof.

Preferably, the conductors 32, 34, 36 are disposed to physically contact the gate electrode 48 and the source/drain region 28 and the patterned metal layers 38, 40, 42 are disposed to physically contact the conductors 32, 34, 36 directly. The conductors 32, 34, 36 are also referred to as conductive plugs to electrically connect to the gate electrode 48 and the source/drain region 28, in which the conductors 32, 34, 36 in this embodiment could also be referred to as via conductors while the patterned metal layers 38, 40, 42 could be referred to as trench conductors. Each of the via conductors 32, 34, 36 and patterned metal layers 38, 40, 42 could further include a barrier layer and a metal layer, in which the barrier layer could be selected from the group consisting of Ti, TiN, Ta, and TaN and the metal layer could selected from the group consisting of W, Cu, Al, TiAl, and CoWP.

It should be noted that even though only a single via conductor (such as conductor 32) and a single patterned metal layer (such as patterned metal layer 38) are formed to connect to each of the source/drain region 28 and gate electrode 48 individually, it would also be desirable to form multiple conductors including but not limited to for example multiple via conductors, multiple trench conductors, or combination thereof to electrically connect to each of the source/drain region 28 and gate electrode 48 separately, which is also within the scope of the present invention.

Moreover, since the via conductors 32, 34, 36, patterned metal layer 38, 40, 42, and surrounding ILD layer 30 are fabricated through a same inter-connective process, the via conductors 32, 34, 36 are preferably disposed on the same level while the patterned metal layers 38, 40, 42 are disposed on the same level. For instance, the top surfaces of the via conductors 32, 34, 36 connected to the source/drain region 28 and gate electrode 48 are coplanar and the top surfaces of the patterned metal layers 38, 40, 42 atop the via conductors 32, 34, 36 are also coplanar.

In this embodiment, a FE layer 20 or negative capacitance (NC) layer is disposed atop the patterned metal layer 40 while an optional buffer layer 50 is disposed between the FE layer 20 and the patterned metal layer 40 and if the buffer layer 50 were to be omitted depending on the demand of the product, the FE layer 20 would be contacting the patterned metal layer 40 directly. It is to be noted that even though the width and thickness of the FE layer 20 is slightly greater than the width and thickness of the patterned metal layer 40 in this embodiment, the width and thickness of the FE layer 20 with respect to the patterned metal layer 40 could also be adjusted depending on the demand of the product. For instance, the FE layer 20 could be formed to have smaller width and/or less thickness than the patterned metal layer 40, which is also within the scope of the present invention.

Similar to the first MOS transistor 18, the second MOS transistor 22 also includes a gate structure 66, a source/drain region 68 adjacent to two sides of the gate structure 66, at least one or more dielectric layer such as interlayer dielectric (ILD) layer 70 disposed on the gate structure 66 and the substrate 12, and conductors 72, 74, 76 and patterned metal layers 78, 80, 82 disposed within the ILD layer 70 to electrically connect to the gate structure 66 and the source/drain region 68. The gate structure 66 further includes a gate dielectric layer 84 or interfacial layer on the substrate 12, a high-k dielectric layer 86 on the gate dielectric layer 84, and a gate electrode 88 on the high-k dielectric layer 86.

In addition, a similar FE layer 24 or NC layer is disposed atop the patterned metal layer 80 on the second region 16 while an optional buffer layer 90 is disposed between the FE layer 24 and the patterned metal layer 80 and if the buffer layer 90 were to be omitted depending on the demand of the product, the FE layer 24 would be contacting the patterned metal layer 80 directly.

It is to be noted that the elements including gate structures 26, 66, source/drain regions 28, 68, ILD layers 30, 70, conductors 32, 34, 36, 72, 74, 76, patterned metal layers 38, 40, 42, 78, 80, 82, buffer layers 50, 90, and FE layers 20, 24 on both first region 14 and second region 16 are essentially formed through the same fabrication process so that the material and location of the aforementioned elements are substantially the same.

However, it is to be noted that the FE layer 20 on the first region 14 and the FE layer 24 on the second region 16 are formed so that the two layers 20, 24 preferably share different capacitance. Preferably, a higher negative capacitance renders a lower threshold voltage, hence if the FE layer 20 on the first region 14 were formed to have higher negative capacitance and the FE layer 24 on the second region 16 were formed to have lower negative capacitance, the threshold voltage of the device or MOS transistor on the first region 14 would be lower than the threshold voltage of the device on the second region 16 thereby achieving a multi-threshold voltage state.

According to an embodiment of the present invention, a difference in the capacitance between the FE layers 20, 24 could be accomplished by three means, including but not limited to for example a difference in area of the FE layers, a difference in thickness of the FE layers, and a difference in dielectric constant of the FE layers.

For instance, as shown in FIG. 1, the FE layer 20 disposed on the first region 14 could have greater area than the FE layer 24 disposed on the second region 16, in which the definition of greater area in this instance could mean greater width, greater length, or a combination of both. Since higher area renders a decrease in threshold voltage, the device or MOS transistor on the first region 14 having FE layer 20 with greater area would have lower threshold voltage than the device on the second region 16 having FE layer 24 with smaller area.

Figure 2:
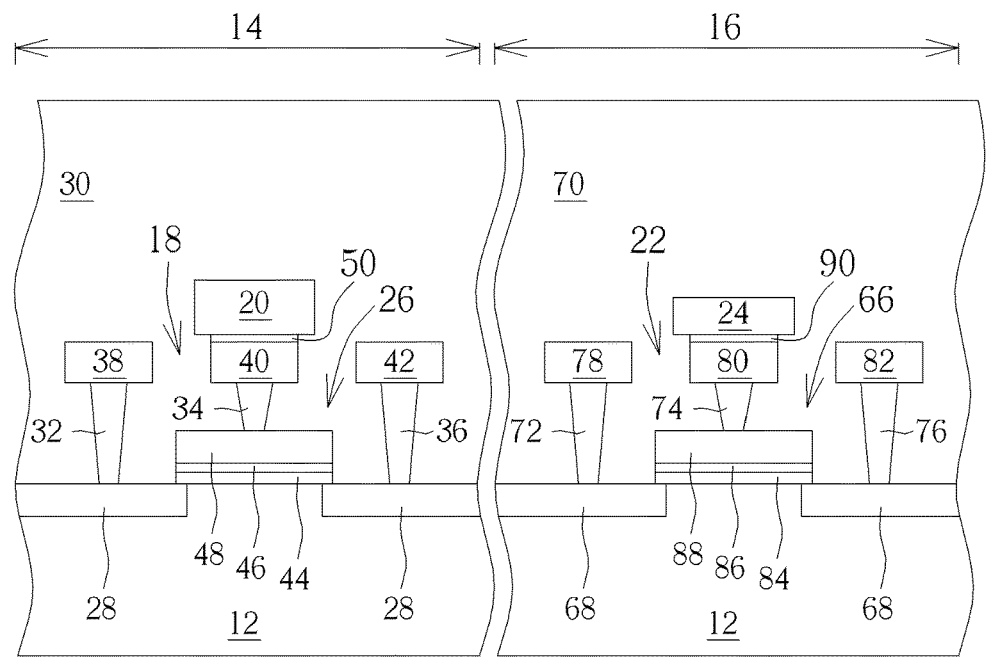
FIG. 2 illustrates a structural view of a semiconductor device according to a variation of the first embodiment of the present invention.

In another example, as shown in FIG. 2, the FE layer 20 disposed on the first region 14 could have greater thickness than the FE layer 24 disposed on the second region 16. Since greater thickness renders an increase in threshold voltage, the device on the first region 14 having FE layer 20 with greater thickness would have higher threshold voltage than the device on the second region 16 having FE layer 24 with less thickness.

According to yet another embodiment of the present invention, the FE layer 20 on the first region 14 could be having higher dielectric constant than the FE layer 16 on the second region 16. Since higher dielectric constant renders a decrease in threshold voltage, the device on the first region 14 having FE layer 20 with higher dielectric constant would have lower threshold voltage than the device on the second region 16 having FE layer 24 with lower dielectric constant.

In this embodiment, the FE layers 20, 24 preferably include material such as, for example but not limited to $HfZrO_x$, $PbZrTiO_x$, $BiFeO_3$, a copolymer of poly(vinylidene fluoride) (PVDF) and trifluoroethylene (TrFE), or combination thereof. Among which, it should be noted that the copolymer of poly(vinylidene fluoride) (PVDF) and trifluoroethylene (TrFE) utilized in this embodiment specifically pertains to a copolymer of poly(vinylidene fluoride) (PVDF) and trifluoroethylene (TrFE) in a 75:25 ratio.

In other embodiments of the present invention, the FE layers 20, 24 could include a material selected from the group consisting of lead zirconate titanate ($PbZrTiO_3$, PZT), lead lanthanum zirconate titanate ($PbLa(TiZr)O_3$, PLZT), strontium bismuth tantalate ($SrBiTa_2O_9$, SBT), bismuth lanthanum titanate (($BiLa)_4Ti_3O_{12}$, BLT), and barium strontium titanate ($BaSrTiO_3$, BST).

The buffer layers 50, 90 between the FE layers 20, 24 and the patterned metal layers 40, 80 could include metal having a work function between valence band and conduction band. For instance, the buffer layers 50, 90 could include metal nitride such as, for example but not limited to, TiN, TaN, titanium silicon nitride (TiSiN), tantalum silicon nitride (TaSiN), or molybdenum nitride (MoN). In other embodiments of the present invention, the buffer layers 50, 90 could include nickel silicide (NiSi), tungsten silicide (WSi), cobalt silicide ($CoSi_2$), or titanium tungsten (TiW), but not limited to this.

In addition to the aforementioned elements, typical transistor elements including but not limited to for example at least a spacer (not shown) could be formed around the gate structures 26, 66, in which the spacer could be a single spacer or composite spacer selected from the group consisting of $SiO_2$, SiN, SiON, and SiCN. Furthermore, selective strain scheme (SSS) can be used in the preferred embodiments of the present invention. For example, a selective epitaxial growth (SEG) method can be used to form the source/drains 28, 68. When the device is a p-typed transistor, epitaxial silicon layers made of silicon germanium (SiGe) could be used to form the source/drains 28, 68. When the device is a n-typed transistor, epitaxial silicon layers made of SiC or SiP could be used to form the source/drains 28, 68. Additionally, salicides (not shown) could be formed on the source/drains 28, 68 and a contact etch stop layer (CESL) (not shown) could be formed on the substrate 12 to cover the gate structures 26, 66.

Figure 3:
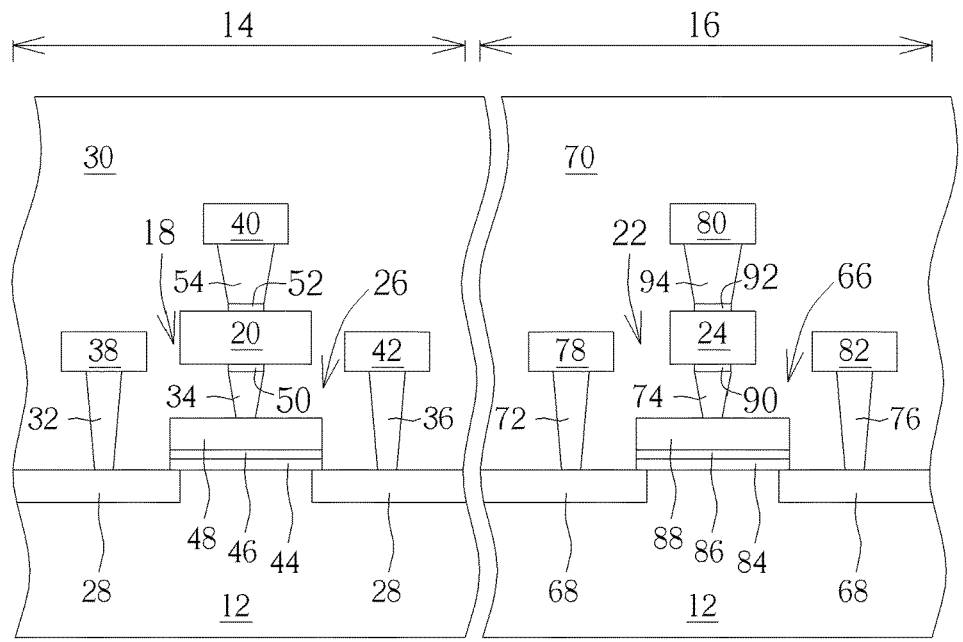
FIG. 3 illustrates a structural view of a semiconductor device according to a second embodiment of the present invention.

Referring to FIG. 3, FIG. 3 illustrates a structural view of a semiconductor device according to a second embodiment of the present invention. As shown in FIG. 3, the semiconductor device preferably includes a substrate 12, a first region 14 and a second region 16 defined on the substrate 12, a first metal-oxide semiconductor (MOS) transistor 18 disposed on the first region 14, a first ferroelectric (FE) layer 20 connected to the first MOS transistor 18, a second MOS transistor 22 disposed on the second region 16, and a second FE layer 24 connected to the second MOS transistor 22.

Similar to the first embodiment, the first region 14 and the second region 16 are defined to fabricate MOS transistors having different threshold voltages in the later process, in which the first region 14 and the second region 16 could share same conductive type or different conductive type depending on the demand of product. For instance, both of the MOS transistors fabricated on the first region 14 and second region 16 could be NMOS transistors, both of the MOS transistors fabricated on the first region 14 and the second region 16 could be PMOS transistors, or one of the MOS transistor fabricated on the first region 14 being a NMOS transistor while the other MOS transistor fabricated on the second region 16 being a PMOS transistor, which are all within the scope of the present invention.

Each of the first MOS transistor 18 and the second MOS transistor 22 includes transistor elements such as a gate structure, source/drain region, and conductive lines electrically connected to the gate structure and the source/drain region.

For instance, the first MOS transistor 18 includes a gate structure 26, a source/drain region 28 adjacent to two sides of the gate structure 26, at least one or more dielectric layer such as interlayer dielectric (ILD) layer 30 disposed on the gate structure 26 and the substrate 12, and conductors 32, 34, 36, 54 and patterned metal layers 38, 40, 42 disposed within the ILD layer 30 to electrically connect to the gate structure 26 and the source/drain region 28. The gate structure 26 further includes a gate dielectric layer 44 or interfacial layer on the substrate 12, a high-k dielectric layer 46 on the gate dielectric layer 44, and a gate electrode 48 on the high-k dielectric layer 46.

Preferably, the conductors 32, 34, 36, 54 are disposed to physically contact the gate electrode 48 and the source/drain region 28, the patterned metal layers 38, 40, 42 are disposed to physically contact the conductors 32, 54, 36 directly, a FE layer 20 or negative capacitance (NC) layer is disposed on the same level as the patterned metal layers 38, 42 to electrically connect to the conductors 34, 54, another conductor 54 is disposed on the FE layer 20, and another patterned metal layer 40 is disposed on the conductor 54. The conductors 32, 34, 36, 54 are also referred to as conductive plugs to electrically connect to the gate electrode 48 and the source/drain region 28, in which the conductors 32, 34, 36, 54 in this embodiment could also be referred to as via conductors while the patterned metal layers 38, 40, 42 could be referred to as trench conductors.

In this embodiment, the FE layer 20 or negative capacitance (NC) layer is disposed between the conductors 34, 54 while optional buffer layers 50, 52 are disposed between the FE layer 20 and the conductors 34, 54 and if the buffer layers 50, 52 were to be omitted depending on the demand of the product, the FE layer 20 would be contacting the conductors 34, 54 directly. It is to be noted that even though the width of the FE layer 20 is slightly greater than the width of the adjacent patterned metal layers 38, 42 while the thickness of the FE layer 20 is slightly less than the thickness of the patterned metal layers 38, 42 in this embodiment, the width and thickness of the FE layer 20 with respect to the patterned metal layers 38, 42 could all be adjusted depending on the demand of the product. For instance, the FE layer 20 could be disposed to have less width and/or greater thickness than the patterned metal layers 38, 42, which is also within the scope of the present invention.

Similar to the first MOS transistor 18, the second MOS transistor 22 also includes a gate structure 66, a source/drain region 68 adjacent to two sides of the gate structure 66, at least one or more dielectric layer such as interlayer dielectric (ILD) layer 70 disposed on the gate structure 66 and the substrate 12, and conductors 72, 74, 76, 94 and patterned metal layers 78, 80, 82 disposed within the ILD layer 70 to electrically connect to the gate structure 66 and the source/drain region 68. The gate structure 66 further includes a gate dielectric layer 84 or interfacial layer on the substrate 12, a high-k dielectric layer 86 on the gate dielectric layer 84, and a gate electrode 88 on the high-k dielectric layer 86.

Preferably, the conductors 72, 74, 76, 94 are disposed to physically contact the gate electrode 88 and the source/drain region 68, the patterned metal layers 78, 80, 82 are disposed to physically contact the conductors 72, 94, 76 directly, a FE layer 24 or negative capacitance (NC) layer is disposed on the same level as the patterned metal layers 78, 82 to electrically connect to the conductors 74, 94, another conductor 94 is disposed on the FE layer 24, and another patterned metal layer 80 is disposed on the conductor 94. The conductors 72, 74, 76, 94 are also referred to as conductive plugs to electrically connect to the gate electrode 66 and the source/drain region 68, in which the conductors 72, 74, 76, 94 in this embodiment could also be referred to as via conductors while the patterned metal layers 78, 80, 82 could be referred to as trench conductors. The FE layer 24 or negative capacitance (NC) layer is disposed between the conductors 74, 94 while optional buffer layers 90, 92 are disposed between the FE layer 24 and the conductors 74, 94 and if the buffer layers 90, 92 were to be omitted depending on the demand of the product, the FE layer 24 would be contacting the conductors 74, 94 directly.

It is to be noted that the elements including gate structures 26, 66, source/drain regions 28, 68, ILD layers 30, 70, conductors 32, 34, 36, 54, 72, 74, 76, 94, patterned metal layers 38, 40, 42, 78, 80, 82, buffer layers 50, 52, 90, 92, and FE layers 20, 24 on both first region 14 and second region 16 are essentially formed through the same fabrication process so that the material and location of the aforementioned elements are substantially the same.

Moreover, the material and variations of the elements including gate structures 26, 66, source/drain regions 28, 68, ILD layers 30, 70, conductors 32, 34, 36, 54, 72, 74, 76, 94, patterned metal layers 38, 40, 42, 78, 80, 82, buffer layers 50, 52, 90, 92, and FE layers 20, 24 in this embodiment are preferably the same as the ones disclose in the first embodiment, and the details of which are not explained herein for the sake of brevity.

However, it is to be noted that the FE layer 20 on the first region 14 and the FE layer 24 on the second region 16 are formed so that the two layers preferably share different capacitance. Preferably, a higher negative capacitance renders a lower threshold voltage, hence if the FE layer 20 on the first region 14 were formed to have higher negative capacitance and the FE layer 24 on the second region 16 were formed to have lower negative capacitance, the threshold voltage of the device or MOS transistor on the first region 14 would be lower than the threshold voltage on the second region 16 thereby achieving a multi-threshold voltage state.

Similar to the first embodiment, a difference in the capacitance between the FE layers 20, 24 could be accomplished by three means, including but not limited to for example a difference in area of the FE layers, a difference in thickness of the FE layers, and a difference in dielectric constant of the FE layers.

For instance, as shown in FIG. 3, the FE layer 20 disposed on the first region 14 could have greater area than the FE layer 24 disposed on the second region 16, in which the definition of greater area in this instance could mean greater width, greater length, or a combination of both. Since higher area renders a decrease in threshold voltage, the device or MOS transistor on the first region 14 having FE layer 20 with greater area would have lower threshold voltage than the device on the second region 16 having FE layer 24 with smaller area.

Figure 4:
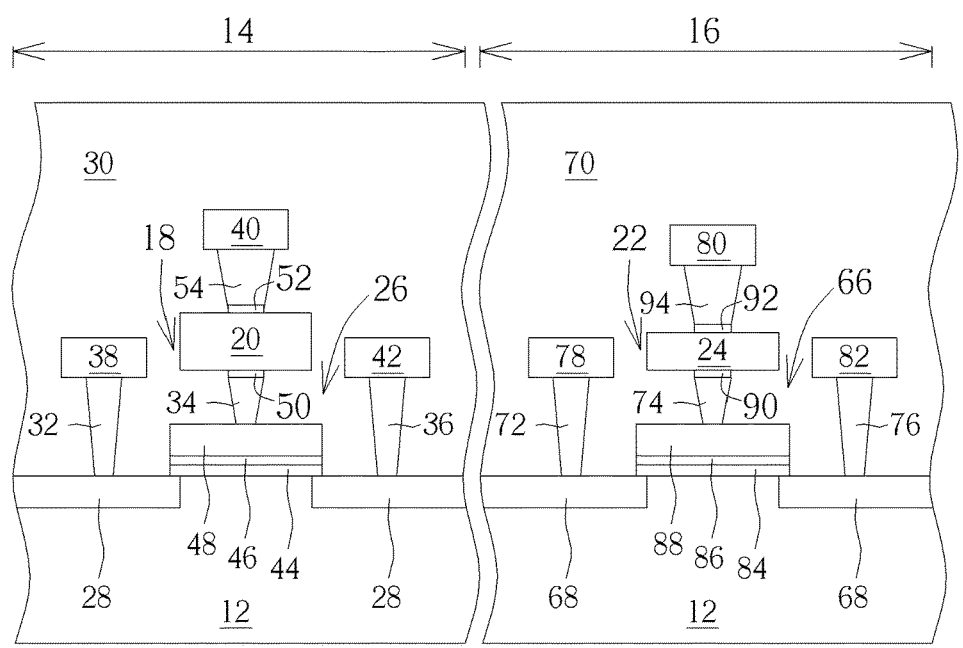
FIG. 4 illustrates a structural view of a semiconductor device according to a variation of the second embodiment of the present invention.

In another example, as shown in FIG. 4, the FE layer 20 disposed on the first region 14 could have greater thickness than the FE layer 24 disposed on the second region 16. Since greater thickness renders an increase in threshold voltage, the device on the first region 14 having FE layer 20 with greater thickness would have higher threshold voltage than the device on the second region 16 having FE layer 24 with less thickness.

According to yet another embodiment of the present invention, the FE layer 20 on the first region 14 could be having higher dielectric constant than the FE layer 16 on the second region 16. Since higher dielectric constant renders a decrease in threshold voltage, the device on the first region 14 having FE layer 20 with higher dielectric constant would have lower threshold voltage than the device on the second region 16 having FE layer 24 with lower dielectric constant.

Figure 5:
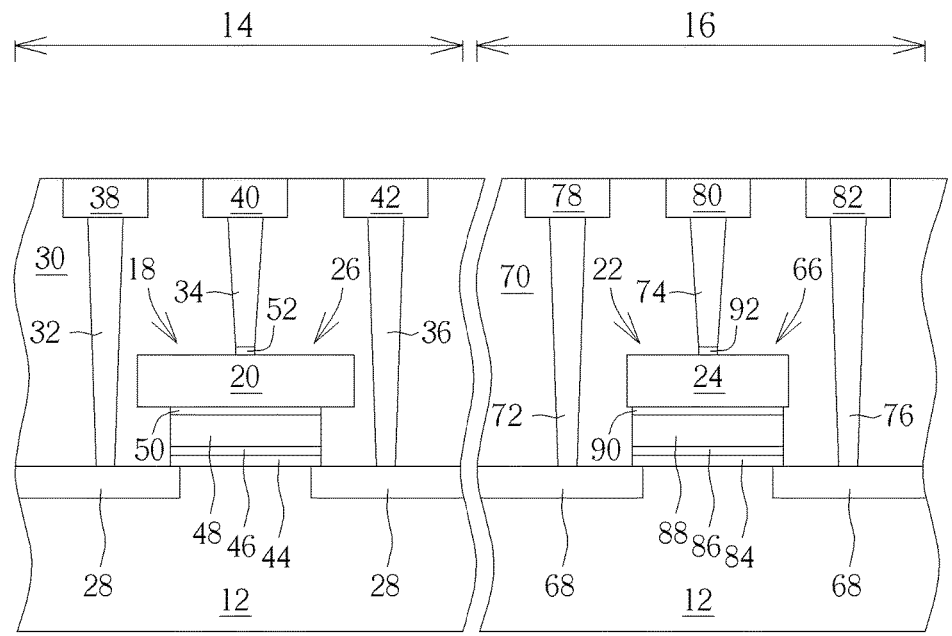
FIG. 5 illustrates a structural view of a semiconductor device according to a third embodiment of the present invention.

Referring to FIG. 5, FIG. 5 illustrates a structural view of a semiconductor device according to a third embodiment of the present invention. As shown in FIG. 5, the semiconductor device preferably includes a substrate 12, a first region 14 and a second region 16 defined on the substrate 12, a first metal-oxide semiconductor (MOS) transistor 18 formed on the first region 14, a first ferroelectric (FE) layer 20 connected to the first MOS transistor 18, a second MOS transistor 22 formed on the second region 16, and a second FE layer 24 connected to the second MOS transistor 22.

Similar to the first embodiment, the first region 14 and the second region 16 are defined to fabricate MOS transistors having different threshold voltages in the later process, in which the first region 14 and the second region 16 could share same conductive type or different conductive type depending on the demand of product. For instance, both of the MOS transistors fabricated on the first region 14 and second region 16 could be NMOS transistors, both of the MOS transistors fabricated on the first region 14 and the second region 16 could be PMOS transistors, or one of the MOS transistor fabricated on the first region 14 being a NMOS transistor while the other MOS transistor fabricated on the second region 16 being a PMOS transistor, which are all within the scope of the present invention.

Each of the first MOS transistor 18 and the second MOS transistor 22 includes transistor elements such as a gate structure, source/drain region, and conductive lines electrically connected to the gate structure and the source/drain region.

For instance, the first MOS transistor 18 includes a gate structure 26, a source/drain region 28 adjacent to two sides of the gate structure 26, at least one or more dielectric layer such as interlayer dielectric (ILD) layer 30 disposed on the gate structure 26 and the substrate 12, and conductors 32, 34, 36 and patterned metal layers 38, 40, 42 formed within the ILD layer 30 to electrically connect to the gate structure 26 and the source/drain region 28. The gate structure 26 further includes a gate dielectric layer 44 or interfacial layer on the substrate 12, a high-k dielectric layer 46 on the gate dielectric layer 44, and a gate electrode 48 on the high-k dielectric layer 46.

Preferably, the conductors 32, 36 are disposed to physically contact the source/drain region 28, a FE layer 20 or negative capacitance (NC) layer is disposed on the gate electrode 48, the conductor 34 is disposed on the FE layer 20, and patterned metal layers 38, 40, 42 are disposed to physically contact the conductors 32, 34, 36 directly.

In this embodiment, the FE layer 20 or negative capacitance (NC) layer is disposed between the gate electrode 48 and the conductor 34 while optional buffer layers 50, 52 are disposed between the gate electrode 48 and the FE layer 20 and also between the FE layer 20 and the conductor 34, and if the buffer layers 50, 52 were to be omitted depending on the demand of the product, the FE layer 20 would be contacting the gate electrode 48 and the conductor 34 directly. It is to be noted that even though the width of the FE layer 20 is slightly greater than the width of the gate electrode 48, the width and thickness of the FE layer 20 with respect to the gate electrode 48 could all be adjusted depending on the demand of the product. For instance, the FE layer 20 could be formed to have even or less width than the gate electrode 48, which are also within the scope of the present invention.

Similar to the first MOS transistor 18, the second MOS transistor 22 also includes a gate structure 66, a source/drain region 68 adjacent to two sides of the gate structure 66, at least one or more dielectric layer such as interlayer dielectric (ILD) layer 70 disposed on the gate structure 66 and the substrate 12, and conductors 72, 74, 76 and patterned metal layers 78, 80, 82 disposed within the ILD layer 70 to electrically connect to the gate structure 66 and the source/drain region 68. The gate structure 66 further includes a gate dielectric layer 84 or interfacial layer on the substrate 12, a high-k dielectric layer 86 on the gate dielectric layer 84, and a gate electrode 88 on the high-k dielectric layer 86.

Preferably, the conductors 72, 76 are formed to physically contact the source/drain region 68, a FE layer 24 or negative capacitance (NC) layer is disposed on the gate electrode 88, the conductor 74 is disposed on the FE layer 24, and patterned metal layers 78, 80, 82 are disposed to physically contact the conductors 72, 74, 76 directly.

In this embodiment, the FE layer 24 or negative capacitance (NC) layer is disposed between the gate electrode 88 and the conductor 74 while optional buffer layers 90, 92 are disposed between the gate electrode 88 and the FE layer 24 and also between the FE layer 24 and the conductor 74, and if the buffer layers 90, 92 were to be omitted depending on the demand of the product, the FE layer 24 would be contacting the gate electrode 88 and the conductor 74 directly. It is to be noted that even though the width of the FE layer 24 is slightly greater than the width of the gate electrode 88, the width and thickness of the FE layer 24 with respect to the gate electrode 88 could all be adjusted depending on the demand of the product. For instance, the FE layer 24 could be formed to have even or less width than the gate electrode 88, which are also within the scope of the present invention.

It is to be noted that the elements including gate structures 26, 66, source/drain regions 28, 68, ILD layers 30, 70, conductors 32, 34, 36, 72, 74, 76, patterned metal layers 38, 40, 42, 78, 80, 82, buffer layers 50, 52, 90, 92, and FE layers 20, 24 on both first region 14 and second region 16 are essentially formed through the same fabrication process so that the material and location of the aforementioned elements are substantially the same.

Moreover, the material and variations of the elements including gate structures 26, 66, source/drain regions 28, 68, ILD layers 30, 70, conductors 32, 34, 36, 72, 74, 76, patterned metal layers 38, 40, 42, 78, 80, 82, buffer layers 50, 52, 90, 92, and FE layers 20, 24 in this embodiment are preferably the same as the ones disclose in the first embodiment, and the details of which are not explained herein for the sake of brevity.

However, it is to be noted that the FE layer 20 on the first region 14 and the FE layer 24 on the second region 16 are formed so that the two layers preferably share different capacitance. Preferably, a higher negative capacitance renders a lower threshold voltage, hence if the FE layer 20 on the first region 14 were formed to have higher negative capacitance and the FE layer 24 on the second region 16 were formed to have lower negative capacitance, the threshold voltage of the device or MOS transistor on the first region 14 would be lower than the threshold voltage on the second region 16 thereby achieving a multi-threshold voltage state.

Similar to the first embodiment, a difference in the capacitance between the FE layers 20, 24 could be accomplished by three means, including but not limited to for example a difference in area of the FE layers, a difference in thickness of the FE layers, and a difference in dielectric constant of the FE layers.

For instance, as shown in FIG. 5, the FE layer 20 disposed on the first region 14 could have greater area than the FE layer 24 disposed on the second region 16, in which the definition of greater area in this instance could mean greater width, greater length, or a combination of both. Since higher area renders a decrease in threshold voltage, the device or MOS transistor on the first region 14 having FE layer 20 with greater area would have lower threshold voltage than the device on the second region 16 having FE layer 24 with smaller area.

Figure 6:
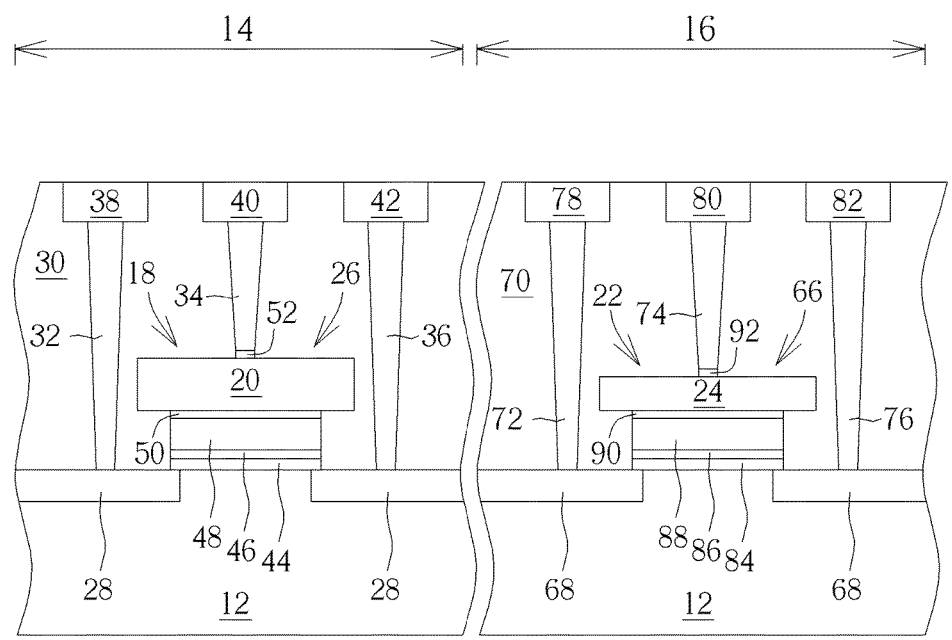
FIG. 6 illustrates a structural view of a semiconductor device according to a variation of the third embodiment of the present invention.

In another example, as shown in FIG. 6, the FE layer 20 disposed on the first region 14 could have greater thickness than the FE layer 24 disposed on the second region 16. Since greater thickness renders an increase in threshold voltage, the device on the first region 14 having FE layer 20 with greater thickness would have higher threshold voltage than the device on the second region 16 having FE layer 24 with less thickness.

According to yet another embodiment of the present invention, the FE layer 20 on the first region 14 could be having higher dielectric constant than the FE layer 16 on the second region 16. Since higher dielectric constant renders a decrease in threshold voltage, the device on the first region 14 having FE layer 20 with higher dielectric constant would have lower threshold voltage than the device on the second region 16 having FE layer 24 with lower dielectric constant.

Figure 7:
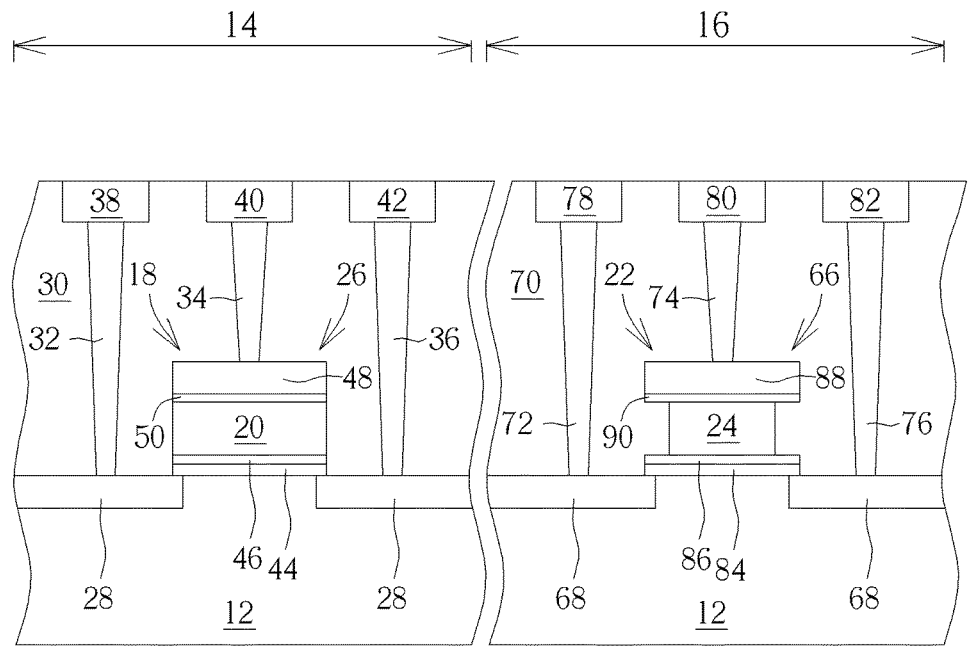
FIG. 7 illustrates a structural view of a semiconductor device according to a fourth embodiment of the present invention.

Referring to FIG. 7, FIG. 7 illustrates a structural view of a semiconductor device according to a fourth embodiment of the present invention. As shown in FIG. 7, the semiconductor device preferably includes a substrate 12, a first region 14 and a second region 16 defined on the substrate 12, a first metal-oxide semiconductor (MOS) transistor 18 formed on the first region 14, a first ferroelectric (FE) layer 20 connected to the first MOS transistor 18, a second MOS transistor 22 formed on the second region 16, and a second FE layer 24 connected to the second MOS transistor 22.

Similar to the first embodiment, the first region 14 and the second region 16 are defined to fabricate MOS transistors having different threshold voltages in the later process, in which the first region 14 and the second region 16 could share same conductive type or different conductive type depending on the demand of product. For instance, both of the MOS transistors fabricated on the first region 14 and second region 16 could be NMOS transistors, both of the MOS transistors fabricated on the first region 14 and the second region 16 could be PMOS transistors, or one of the MOS transistor fabricated on the first region 14 being a NMOS transistor while the other MOS transistor fabricated on the second region 16 being a PMOS transistor, which are all within the scope of the present invention.

Each of the first MOS transistor 18 and the second MOS transistor 22 includes transistor elements such as a gate structure, source/drain region, and conductive lines electrically connected to the gate structure and the source/drain region.

For instance, the first MOS transistor 18 includes a gate structure 26, a source/drain region 28 adjacent to two sides of the gate structure 26, at least one or more dielectric layer such as interlayer dielectric (ILD) layer 30 disposed on the gate structure 26 and the substrate 12, and conductors 32, 34, 36 and patterned metal layers 38, 40, 42 disposed within the ILD layer 30 to electrically connect to the gate structure 26 and the source/drain region 28. The gate structure 26 further includes a gate dielectric layer 44 or interfacial layer on the substrate 12, a high-k dielectric layer 46 on the gate dielectric layer 44, and a gate electrode 48 on the high-k dielectric layer 46.

Preferably, the conductors 32, 34, 36 are formed to physically contact the gate electrode 48 and the source/drain region 28, the patterned metal layers 38, 40, 42 are disposed to physically contact the conductors 32, 34, 36 directly, and a FE layer 20 or negative capacitance (NC) layer is disposed between the gate dielectric layer 44 and the gate electrode 48.

In this embodiment, the FE layer 20 or negative capacitance (NC) layer is sandwiched between the gate electrode 48 and the high-k dielectric layer 46 while an optional buffer layer 50 is disposed between the gate electrode 48 and the FE layer 20, and if the buffer layer 50 were to be omitted depending on the demand of the product, the FE layer 20 would be contacting the gate electrode 48 and the high-k dielectric layer 46 directly.

Similar to the first MOS transistor 18, the second MOS transistor 22 also includes a gate structure 66, a source/drain region 68 adjacent to two sides of the gate structure 66, at least one or more dielectric layer such as interlayer dielectric (ILD) layer 70 disposed on the gate structure 66 and the substrate 12, and conductors 72, 74, 76 and patterned metal layers 78, 80, 82 disposed within the ILD layer 70 to electrically connect to the gate structure 66 and the source/drain region 68. The gate structure 66 further includes a gate dielectric layer 84 or interfacial layer on the substrate 12, a high-k dielectric layer 86 on the gate dielectric layer 84, and a gate electrode 88 on the high-k dielectric layer 86.

Preferably, the conductors 72, 74, 76 are formed to physically contact the gate electrode 88 and the source/drain region 68, the patterned metal layers 78, 80, 82 are disposed to physically contact the conductors 72, 74, 76 directly, and a FE layer 24 or negative capacitance (NC) layer is disposed between the gate dielectric layer 84 and the gate electrode 88.

Similar to the first MOS transistor, the FE layer 24 or negative capacitance (NC) layer is sandwiched between the gate electrode 88 and the high-k dielectric layer 86 while an optional buffer layer 90 is disposed between the gate electrode 88 and the FE layer 24, and if the buffer layer 90 were to be omitted depending on the demand of the product, the FE layer 24 would be contacting the gate electrode 88 and the high-k dielectric layer 86 directly.

It is to be noted that the elements including gate structures 26, 66, source/drain regions 28, 68, ILD layers 30, 70, conductors 32, 34, 36, 72, 74, 76, patterned metal layers 38, 40, 42, 78, 80, 82, buffer layers 50, 90, and FE layers 20, 24 on both first region 14 and second region 16 are essentially formed through the same fabrication process so that the material and location of the aforementioned elements are substantially the same.

Moreover, the material and variations of the elements including gate structures 26, 66, source/drain regions 28, 68, ILD layers 30, 70, conductors 32, 34, 36, 72, 74, 76, patterned metal layers 38, 40, 42, 78, 80, 82, buffer layers 50, 90, and FE layers 20, 24 in this embodiment are preferably the same as the ones disclose in the first embodiment, and the details of which are not explained herein for the sake of brevity.

However, it is to be noted that the FE layer 20 on the first region 14 and the FE layer 24 on the second region 16 are disposed so that the two layers preferably share different capacitance. Preferably, a higher negative capacitance renders a lower threshold voltage, hence if the FE layer 20 on the first region 14 were formed to have higher negative capacitance and the FE layer 24 on the second region 16 were formed to have lower negative capacitance, the threshold voltage of the device or MOS transistor on the first region 14 would be lower than the threshold voltage on the second region 16 thereby achieving a multi-threshold voltage state.

Similar to the first embodiment, a difference in the capacitance between the FE layers 20, 24 could be accomplished by three means, including but not limited to for example a difference in area of the FE layers, a difference in thickness of the FE layers, and a difference in dielectric constant of the FE layers.

For instance, as shown in FIG. 7, the FE layer 20 disposed on the first region 14 could have greater area than the FE layer 24 disposed on the second region 16, in which the definition of greater area in this instance could mean greater width, greater length, or a combination of both. Since higher area renders a decrease in threshold voltage, the device or MOS transistor on the first region 14 having FE layer 20 with greater area would have lower threshold voltage than the device on the second region 16 having FE layer 24 with smaller area.

Figure 8:
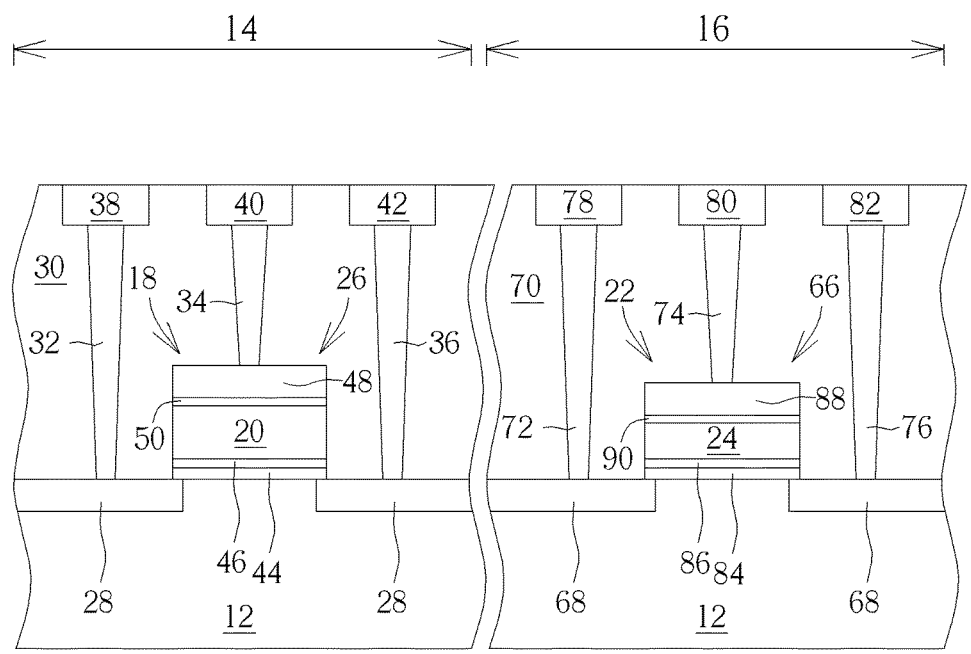
FIG. 8 illustrates a structural view of a semiconductor device according to a variation of the fourth embodiment of the present invention.

In another example, as shown in FIG. 8, the FE layer 20 disposed on the first region 14 could have greater thickness than the FE layer 24 disposed on the second region 16. Since greater thickness renders an increase in threshold voltage, the device on the first region 14 having FE layer 20 with greater thickness would have higher threshold voltage than the device on the second region 16 having FE layer 24 with less thickness.

According to yet another embodiment of the present invention, the FE layer 20 on the first region 14 could be having higher dielectric constant than the FE layer 16 on the second region 16. Since higher dielectric constant renders a decrease in threshold voltage, the device on the first region 14 having FE layer 20 with higher dielectric constant would have lower threshold voltage than the device on the second region 16 having FE layer 24 with lower dielectric constant.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a first metal-oxide semiconductor (MOS) transistor on a substrate;
   a first ferroelectric (FE) layer connected to the first MOS transistor, wherein the first FE layer is overlapped by a first gate electrode of the first MOS transistor entirely;
   a first buffer layer under and directly contacting the first FE layer, wherein a width of the first FE layer is greater than a width of the first buffer layer;
   a second MOS transistor on the substrate;
   a second FE layer connected to the second MOS transistor, wherein the first FE layer and the second FE layer comprise different capacitance and different widths and the second FE layer is overlapped by a second gate electrode of the second MOS transistor entirely; and
   a second buffer layer under and directly contacting the second FE layer, wherein a width of the second FE layer is greater than a width of the second buffer layer.

2. The semiconductor device of claim 1, wherein the first MOS transistor comprises:
   the first gate electrode on the substrate; and
   a first source/drain region adjacent to two sides of the first gate electrode, wherein the second MOS transistor comprises:
   the second gate electrode on the substrate; and
   a second source/drain region adjacent to two sides of the second gate electrode.

3. The semiconductor device of claim 2, further comprising:
   a first conductor physically contacting the first gate electrode;
   a second conductor physically contacting the first source/drain region;
   a third conductor physically contacting the second gate electrode; and
   a fourth conductor physically contacting the second source/drain region.

4. The semiconductor device of claim 3, further comprising:
   a first metal layer physically contacting the first conductor;
   a second metal layer physically contacting the second conductor;
   the first FE layer is on the first metal layer;
   a third metal layer physically contacting the third conductor;
   a fourth metal layer physically contacting the fourth conductor; and
   the second FE layer is on the third metal layer.

5. The semiconductor device of claim 4, wherein the first FE layer and the second FE layer comprise different area.

6. The semiconductor device of claim 4, wherein the first FE layer and the second FE layer comprise different thickness.

7. The semiconductor device of claim 4, wherein the first FE layer and the second FE layer comprise different dielectric constant.

8. The semiconductor device of claim 3, further comprising:
   the first FE layer on the first conductor;
   a second metal layer physically contacting the second conductor;
   a fifth conductor on the first FE layer;
   the second FE layer on the third conductor;
   a fourth metal layer physically contacting the fourth conductor; and
   a sixth conductor on the second FE layer.

9. The semiconductor device of claim 8, wherein the first FE layer and the second FE layer comprise different area.

10. The semiconductor device of claim 8, wherein the first FE layer and the second FE layer comprise different thickness.

11. The semiconductor device of claim 8, wherein the first FE layer and the second FE layer comprise different dielectric constant.

12. The semiconductor device of claim 2, further comprising:

the first FE layer on the first gate electrode; and
the second FE layer on the second gate electrode.

13. The semiconductor device of claim 12, wherein the first FE layer and the second FE layer comprise different area.

14. The semiconductor device of claim 12, wherein the first FE layer and the second FE layer comprise different thickness.

15. The semiconductor device of claim 12, wherein the first FE layer and the second FE layer comprise different dielectric constant.

16. The semiconductor device of claim 1, wherein the first MOS transistor and the second MOS transistor comprise different conductive type.

* * * * *